United States Patent [19]

Ichimura et al.

[11] Patent Number: 5,192,634
[45] Date of Patent: Mar. 9, 1993

[54] A-SELENIUM-TELLURIUM PHOTOSENSITIVE MEMBER AND ELECTROSTATIC INFORMATION RECORDING METHOD

[75] Inventors: Kohji Ichimura; Minoru Utsumi, both of Tokyo, Japan

[73] Assignee: Dai Nippon Printing Co., Ltd., Tokyo, Japan

[21] Appl. No.: 652,189

[22] Filed: Feb. 7, 1991

[30] Foreign Application Priority Data

Feb. 7, 1990 [JP] Japan .................................... 2-28694
Jul. 11, 1990 [JP] Japan ................................. 2-183564

[51] Int. Cl.$^5$ ............................................. G03G 5/085
[52] U.S. Cl. ........................................ 430/85; 430/128
[58] Field of Search ....................... 430/128, 84, 85, 86

[56] References Cited

U.S. PATENT DOCUMENTS 4,822,712 4/1989 Foley et al. ......................... 430/128
4,842,973 6/1989 Badesha et al. ..................... 430/128

Primary Examiner—John Goodrow
Attorney, Agent, or Firm—Dellett, Smith-Hill and Bedell

[57] ABSTRACT

The a-selenium-tellurium photosensitive member according to the present invention comprises an electric charge injection preventive layer, an a-selenium-tellurium mixed vacuum evaporation layer of 0.03-0.2 μm thick having tellurium concentration within the range of 20-50 wt % with uniform concentration on the deposited surface, and an electric charge transport layer, and these three layers are sequentially laminated on a transparent electrode layer. Thus, a-selenium-tellurium layer is formed in thin film, and thermal excitation carrier and injection carrier can be reduced to very low level even when tellurium concentration is increased. The increase of dark current is not very high. Panchromatic property can be provided in visible light region, and the sensitivity can be improved even in short wavelength region.

4 Claims, 6 Drawing Sheets

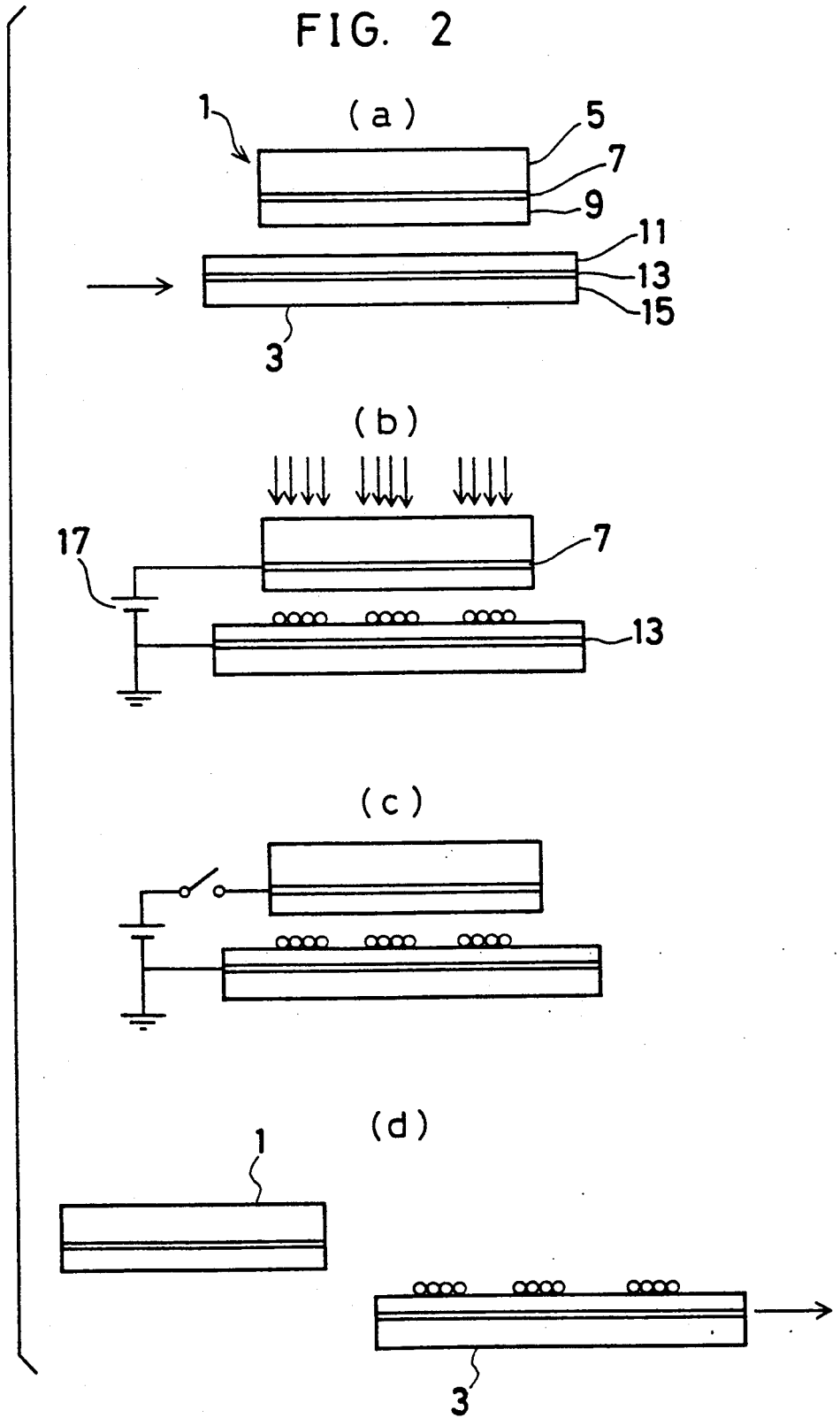

5,192,634

A-SELENIUM-TELLURIUM PHOTOSENSITIVE MEMBER AND ELECTROSTATIC INFORMATION RECORDING METHOD

BACKGROUND OF THE INVENTION

The present invention relates to an a-selenium-tellurium photosensitive member having spectral sensitivity in visible light region, particularly in long wavelength region, and having low dark potential, and it also relates to an electrostatic information recording method using such photosensitive member.

Conventionally, silver salt photographing method is known as a photographing technique with high sensitivity. In this photographing technique, the photographed image is recorded on film and the like through development process. To reproduce the image, silver salt emulsion (such as photographic paper) is used or the developed film is optically scanned and the image is reproduced on cathode ray tube (CRT).

Also, an electrophotographic technique is known. In this technique, an electrode is vacuum-deposited on photoconductive layer, and electric charging over the whole surface of the photoconductive layer is performed by corona charging in dark place. Then, it is exposed to strong light to turn the exposed portion of the photo-conductive layer to conductive. By leaking and removing the electric charge on that portion, electrostatic latent image is optically formed on the surface of the photoconductive layer. By attaching toner having electric charge with the polarity opposite to the residual electrostatic charge (or electric charge with the same polarity), the image is developed. This technique is mostly used for duplicating purpose. Because of low sensitivity, it cannot be used for photographing, and toner development is usually performed immediately after electrostatic latent image is formed because electrostatic charge retaining time is short.

In the television photographing technique, the image is photographed by pickup tube, and the image information obtained through photoconductor is taken up as electric signal, and this is outputted directly on CRT or recorded on video by magnetic recording, and it is then outputted on CRT at the desired time.

Silver salt photographing method is advantageous in preserving the photographed image, while development process is required to form silver salt image. In reproducing the image, complicated optical, electrical or chemical processings are required to obtain hard copy, soft copy (CRT output), etc.

The electrophotographing technique is advantageous in that it is simpler and faster than silver salt photographing method in reproducing electrostatic latent image, while it is inferior to silver salt method in the point that the time of latent image preservation is extremely short and it is inferior in the dissociation of developer and image quality.

In the television photographing technique, electric signal obtained by pickup tube is taken out, and linear sequential scanning is required for recording. Linear sequential scanning is performed by electron beam in pickup tube or by magnetic head in video recording. Because the resolution depends upon the number of scanning lines, it is extremely inferior to planar analog recording such as silver salt photographing.

The same applies to the resolution in case of television photographing system using solid-state image pickup element (such as CCD) developed in recent year.

The problems with these techniques are such that the processing is complicated when image can be recorded in high quality and high resolution, while memory function is missing or image quality is basically inferior when the process is simpler.

In an electrostatic information recording method, a photosensitive member comprising a photoconductive layer provided with an electrode on front thereof and an electric charge carrying medium comprising an electric charge retaining layer provided with an electrode on backside thereof are placed face-to-face along optical axis, and electrostatic latent image corresponding to the incident light image is formed on the electric charge carrying medium by the exposure to light under voltage application between two electrodes. When amorphous selenium layer (a-Se layer) is used as photoconductive layer in the photosensitive member, a problem arises that the sensitivity to red color is low.

a-selenium is known as a substance to generate positive electric charge under light irradiation and also as a substance to transport positive electric charge (hole). Because of the band gap of about 2.0 eV, it has almost no sensitivity to visible light having wavelength of 600–700 nm although it has sufficient sensitivity to the light having wavelength of 500 nm or less. Therefore, by doping tellurium to selenium, it is attempted to reduce the band gap and to provide high sensitivity to the light of long wavelength.

However, because tellurium itself has no photoconductive property, thermal excitation carrier increases when tellurium quantity is increased, and the increase of dark current is induced. Specifically, selenium and electrode form a so-called blocking contact and prevents the electric charge injected from the electrode. When tellurium is added, the blocking property is weakened.

On the other hand, it is necessary to have electric charge generating layer having thickness of 5–3 μm in order to increase the availability of light. However, to prevent the electric charge injected from the electrode with such thickness, the quantity of tellurium can only be increased by 20–25 wt % at the highest. Even when the electric charge preventive layer of about 0.1 μm thick is provided to prevent the injection of electric charge, the electric charge is increased when the quantity of tellurium exceeds 30 wt %, and spectral sensitivity cannot be obtained in the long wavelength region.

To solve the above problems, the object of the present invention is to offer an electrostatic information recording method, by which it is possible to perform recording for long time with high quality and high resolution with simpler process by the use of a-selenium-tellurium photosensitive member, which has spectral sensitivity for long wavelength region and having low dark potential. It is also possible to repeatedly reproduce the memorized characters, diagrams, images, codes, or (1.0) information for each purpose and with the desired image quality at the desired time.

SUMMARY OF THE INVENTION

The a-selenium-tellurium photosensitive member according to the present invention is a photosensitive member, in which electric charge injection preventive layer, electric charge generating layer and electric charge transport layer are sequentially laminated on a transparent electrode layer, characterized in that said electric charge generating layer is formed with a-selenium-tellurium mixed vacuum-deposition layer (hereinafter simply referred as a-selenium-tellurium layer), that tellurium concentration on said a-selenium-tellurium mixed vacuum-deposition layer is within the range of 20-50 wt % and in uniform concentration on the vacuum-deposited surface, and that the film thickness of 0.03-0.2 μm and electric charge transport layer is laminated in thickness of 30 μm or more.

The a-selenium-tellurium photosensitive member of this invention is characterized in that said a-selenium-tellurium mixed vapor deposition layer is provided on the electric charge preventive layer via an a-selenium layer of 50-1000 Å thick, substantially not containing tellurium component.

Further, a-selenium-tellurium photosensitive member of this invention is characterized in that said a-selenium-tellurium mixed deposition layer is formed with concentration gradient so that a-selenium layer substantially not containing tellurium component is formed on transparent electrode side and more tellurium component is contained in the lateral direction of the layer.

In the photosensitive member of this invention, thermal excitation carrier and injection carrier can be suppressed at very low level even when the thickness of a-selenium-tellurium layer is made thinner and tellurium concentration is increased, and the increase of dark current is not noticeable very much. It has panchromatic property in visible light region and has high sensitivity in short wavelength region. By laminating a-selenium-tellurium layer on electric charge injection preventive layer through a-selenium layer, the increase of dark current can be prevented.

Next, the electrostatic information recording method of this invention comprises said photosensitive member placed face-to-face to an electric charge carrying medium consisting of an electrode layer and an electric charge retaining layer on optical axis, and it is characterized in that electrostatic latent image corresponding to incident light image is formed on the electric charge carrying medium by the exposure to light with voltage applied between two electrodes or by applying voltage under exposure.

In so doing, it is possible to have sharp contrast between light potential and dark potential during information recording to the electric charge carrying medium, to perform panchromatic information recording in visible light region on the electric charge carrying medium and to improve the recording sensitivity to the electric charge carrying medium even in short wavelength region.

BRIEF DESCRIPTION OF THE DRAWINGS

FIG. 1 (b) is a cross-sectional view of another photosensitive member of this invention;

FIG. 1 (c) is a drawing to explain tellurium concentration distribution in a-selenium-tellurium layer;

FIGS. 2 (a) through 2(d) are drawings to explain the electrostatic information recording method of this invention;

DESCRIPTION OF THE PREFERRED EMBODIMENT

In the following, detailed description is given on a-selenium-tellurium photosensitive member and electrostatic information recording method of this invention.

Figure 1A:
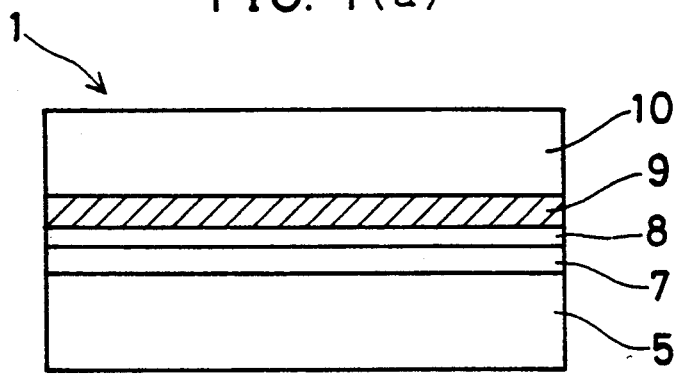
FIG. 1 (a) is a cross-sectional view of a photosensitive member of this invention.
Figure 1B:
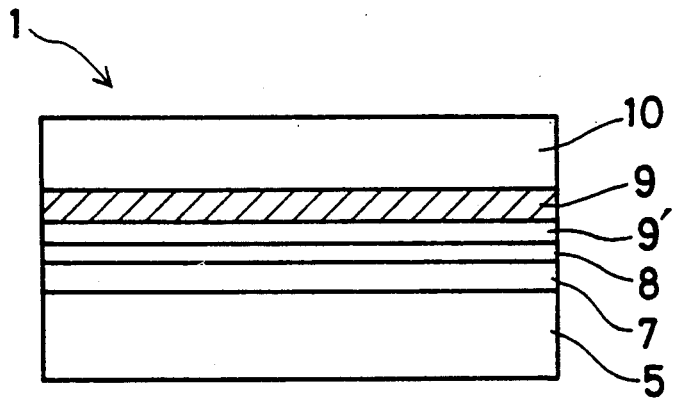
Figure 1C:
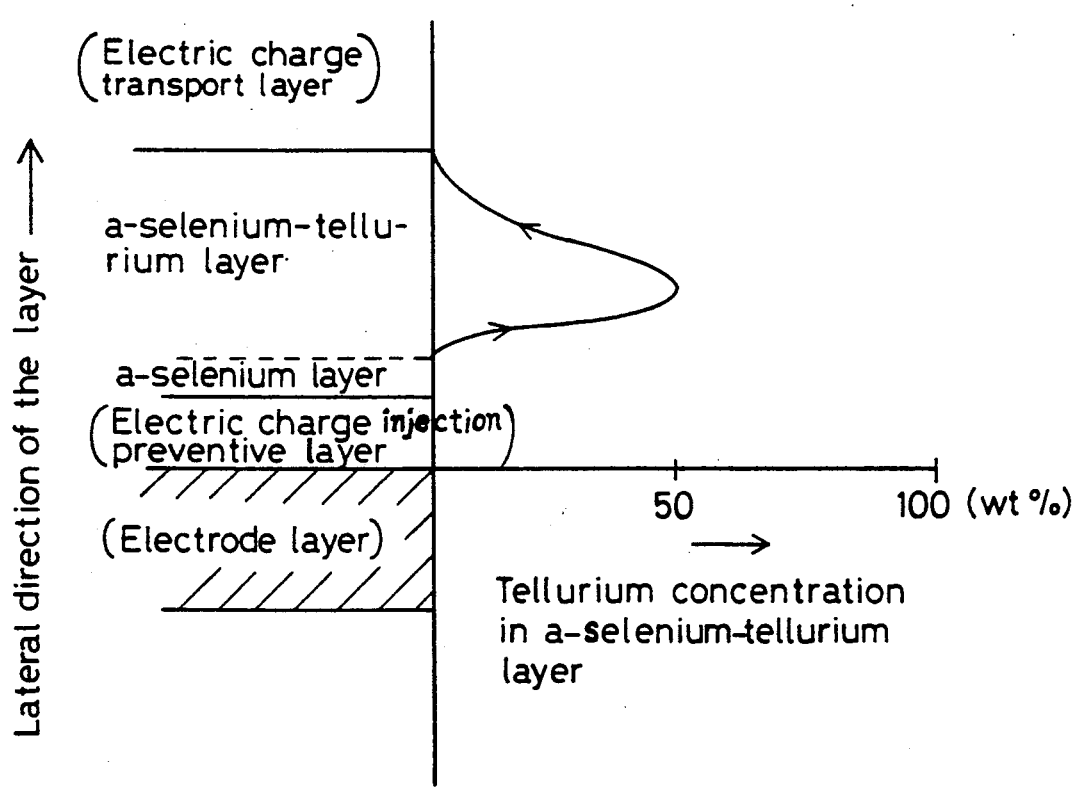

FIGS. 1 (a) and (b) are cross-sectional views of the photosensitive member of this invention. In the figures, 1 represents a photosensitive member, 5 a transparent support member, 7 a transparent electrode, 8 an electric charge injection preventive layer, 9 an a-selenium-tellurium layer, 9' an a-selenium layer, and 10 an electric charge transport layer.

First, as shown in FIG. 1 (a), the photosensitive member of the invention comprises an a-selenium-tellurium layer 9, which is laminated as electric charge generating layer on a transparent electrode 7 of transparent support member 5 through an electric charge injection preventive layer 8. Then, an electric charge transport layer 10 having the function to transport electric charge generated under the presence of electric field is further laminated on it.

As shown in FIG. 1 (b), the photosensitive member of this invention may comprise transport electrode 7, electric charge injection preventive layer and a-selenium layer 9' substantially not containing tellurium component, a-selenium-tellurium layer 9, and electric charge transport layer sequentially laminated on transport support member 5.

The electric charge generating layer 9 formed through mixed vacuum deposition of a-selenium-tellurium is to generate electric charge, which becomes light carrier under light irradiation. a-selenium-tellurium layer has hight-absorbing property in visible light region, particularly in long wavelength region, generates light carrier (hole) and the light carrier can move in lateral direction of the layer under the presence of electric field. Its effect becomes remarkable in case electric field is present. a-selenium absorbs the light having wavelength of 500 nm or less, while tellurium component absorbs the light having wavelength of 600-800 nm.

The a-selenium-tellurium layer of this invention is formed on electric charge injection preventive layer, and tellurium concentration is uniform within the range of 20-50 wt % and film thickness is 0.03-0.2 μm.

Such a-selenium-tellurium layer can be produced as follows: Selenium and tellurium are placed in separate crucibles in a vacuum evaporation unit. The correlation between the deposition rate of selenium and tellurium and the composition of a-selenium-tellurium vacuum deposition film is to be obtained in advance. By independently measuring the deposition rate of each evaporation source by crystal oscillator type thickness gauge, vacuum deposition is performed through feedback of evaporation source power supply to attain a constant deposition rate ratio. Thus, the tellurium concentration in the vacuum deposition film can be easily controlled.

Tellurium concentration in a-selenium-tellurium layer must be maintained at uniform level on the vacuum deposited layer. If there are some variations in tellurium concentration in the surface, spectral sensitivity varies accordingly, resulting in the disturbed image.

It is necessary that this concentration is kept on uniform level within the range of 20–50 wt %. If the concentration is less than 20 wt %, light absorbing property in the long wavelength region is lost. If it exceeds 50 wt %, it is not desirable because dark current increases.

Further, it is preferable that the thickness of this a-selenium-tellurium layer is 0.03–0.2 μm. If the thickness is less than 0.03 μm, light absorbing property is lost. If it exceeds 0.2 μm, dark current increases.

There is another aspect of the invention, in which the increase of dark current is prevented by laminating a-selenium-tellurium layer on electric charge injection preventive layer through a-selenium layer.

Such a-selenium layer can be formed by vacuum-depositing selenium on electric charge injection preventive layer in thickness of 50–1000 Å, or more preferably 300–500 Å. If the thickness of the layer substantially not containing tellurium component is less than 50 Å, it is not desirable because dark current increases. If it exceeds 1000 Å, light transmittance decreases, and it is difficult to absorb light in electric charge generating layer. In the layer substantially not containing tellurium, tellurium component may be contained by less than 10 wt %. Its content is determined adequately by the relation with dark current value.

The electric charge generating layer 9 may be formed by laminating a-selenium-tellurium layer 9, first a-selenium layer 9' not containing tellurium component in lateral direction of the layer, and then, with concentration gradient in the content of tellurium component.

To give concentration gradient to tellurium component, selenium and tellurium are placed in two separate crucibles in a vacuum evaporation unit, and vacuum evaporation velocity is independently monitored. The correlation between vacuum evaporation velocity of selenium and tellurium and the composition of a-selenium-tellurium vacuum-evaporation film has to be obtained in advance. By controlling the vacuum evaporation velocity of each component, the tellurium concentration in the vacuum-deposited film can be easily controlled.

FIG. 1 (c) shows an example of concentration distribution. First, only a-selenium is vacuum-deposited in thickness of 50–1000 Å, or more preferably 300–500 Å.

Next, vacuum evaporation quantity of tellurium is gradually increased while continuing vacuum evaporation of selenium so that tellurium content reaches 50 wt % at maximum.

After tellurium component reaches maximum concentration in a-selenium-tellurium layer, it is not necessary to have substantially high tellurium concentration in relation to light transmittance from photosensitive member electrode. For the bonding with electric charge transport layer to be laminated on the electric charge generating layer, tellurium concentration in a-selenium-tellurium layer is decreased and lamination is performed so that concentration is decreased and that tellurium component reaches 0 wt %. This is not necessary if electric charge from electric charge generating layer to electric charge transport layer is efficiently injected.

The film thickness having the tellurium content at maximum is determined by the relation to light incident quantity.

Next, description is given on electric charge transport layer to be laminated on electric charge generating layer.

The electric charge transport layer has electric charge transport property under voltage application, and it is formed with hole transport material. As such electric charge transport layer, a-silicon layer doped with boron, aluminum, indium, etc. or a-selenium layer, laminated by glow discharge method, vacuum evaporation method, sputtering method, CVD method, etc. may be used. Or, organic photoconductive material such as oxadiazole, pyrazoline, polyvinylcarbazole, stilbene, anthracene, naphthalene, tridiphenylmethane, triphenylmethane, azine, amine, aromatic amine, etc. may be dispersed in resin and laminated by coating method using blade coater to form in thickness of 30–100 μm.

If the thickness of electric charge transport layer is thinner than 30 μm, voltage distribution needed for photosensitive member cannot be provided, and sufficient contrast cannot be maintained between the exposed portion (light portion) and dark portion. If it exceeds 100 μm, the carrier disappears in the electric charge transport layer because of the relation with carrier life.

It is preferable that a-selenium is vacuum-deposited after the lamination of a-selenium-tellurium layer in the electric charge transport layer.

Next, description is given on the electric charge injection preventive layer to be provided on transparent electrode.

Electric charge injection preventive layer is furnished to prevent the increase of dark current, which is caused by the injection of electric charge from the electrode under the presence of electric field as if it is exposed to light although not actually exposed. It is formed in thickness of 0.01–10 μm by vacuum evaporation, sputtering, or glow discharge method of $SiO_2$, $Al_2O_3$, SiC, or SiN layer.

The electric charge injection preventive layer can be formed with the substance having electric charge transport property with opposite polarity to the electrode so that electric charge injection preventive effect can be obtained as desired by the rectifying effect. Because the electric charge generating layer of this invention has hole generating property, it may has electron transport property under the presence of electric field. For example, amorphous silicon photoconductive layer doped with P, N, As, Sb, Bi, etc. may be formed by glow discharge, vacuum evaporation, sputtering, CVD method, etc. or ZnO photoconductive layer may be formed by coating and the like. Such electric charge injection preventive layer may be formed in thickness of 0.1–10 μm.

There is no special restriction in material and thickness of the photosensitive member support member 5 as far as it has the strength enough to support photosensitive member. Because light enters from the side of the photosensitive member, transparent glass plate of about 1 mm thick, or plastic film, sheet, etc. may be used.

The transparent electrode 7 is formed on a transparent support member 5, and there is no restriction on its material as far as the specific resistance is $10^6 \Omega \cdot cm$ or less, and it is laminated in thickness of 100–3000 Å. If the information light is visible light (400–700 nm), the following electrodes can be used: Transparent electrode coated with ITO ($In_2O_3$-$SnO_2$), $SnO_2$, etc. by sputtering, vacuum evaporation or by coating fine powder of these substances after turning it into ink-like state with binder, semitransparent electrode obtained by vacuum evaporation or by sputtering of Au, Al, Ag, Ni, Cr, etc.

or organic transparent electrode coated with tetracyanoquinodimethane (TCNQ), polyacetylene, etc.

In case information light is infrared light (700 nm or more), the above electrode materials may be used. In some cases, colored visible light absorption electrode can be used to cut off visible light.

Further, the above electrode materials can be basically used in case information light is ultraviolet light (400 nm or less), while it is not desirable to use support member absorbing ultraviolet light (such as organic macromolecular material, soda glass, etc.), and the material to transmit ultraviolet light such as quartz glass is preferably used.

Thus, the photosensitive member of this invention is obtained. By laminating discharge reinforcement layer on the electric charge transport layer, the discharge function can be strengthened more. As the discharge reinforcement layer, the materials for metal compounds or metal oxides such as BaO, CaO, SrO, MgO, $CeB_4$, Sb-Rb-Cs, Ag-0-Cs, W-Th, TiC, TiO, $Y_2O_3$, $La_2O_3$, $Dy_2O_3$, $ThO_2$, etc. can be used.

Such discharge reinforcement layer is produced by normal thin film forming methods such as vacuum evaporation method, sputtering method, plasma CVD method or coating method by dispersing in binder, etc. on upper surface of the electric charge transport layer. It is preferable that the thickness is 50–5000 Å, or more preferably 100–1000 Å.

Next, description is given on the electrostatic information recording method of this invention in connection with FIG. 2. In the figure, 1 represents a photosensitive member, 3 an electric charge carrying medium, 5 a support member for photosensitive member, 7 a photosensitive member electrode, 8 an electric charge injection preventive layer, 9 an a-selenium-tellurium layer, 10 an electric charge transport layer, 11 an electric charge retaining layer, 13 an electric charge carrying medium electrode, 15 an electric charge retaining layer support member, and 17 a power source.

The electric charge carrying medium 3, where electrostatic latent image is formed by the photosensitive member of this invention, is obtained by laminating electric charge retaining layer 11 on an electrode 13. The electric charge retaining layer 11 consists of macromolecular material having high insulating property in order to suppress the shifting of electric charge, and it must have the insulating property with specific resistance of $10^-\Omega.cm$ or more. The macromolecular material to constitute the electric charge retaining layer must have glass transition temperature higher than the operating environmental temperature. As such macromolecular materials, thermoplastic resin, or energy beam setting resin such as thermosetting resin, UV-setting resin, electron beam setting resin, etc. or engineering plastics may be used. As thermoplastic resin, fluororesin, e.g. polytetrafluoroethylene, fluorinated ethylenepropylene, tetrafluoroethylene-perfluoroalkylvinylether copolymer or dispersion type or degenerated type (coating type) of these substances or polyether-etherketone resin, polyparaxylylene, etc. may be used. These substances are laminated on the electric charge carrying medium electrode by coating or vacuum evaporation.

Next, description is given on the electrostatic information recording method, by which electrostatic latent image is formed on the electric charge carrying medium by performing exposure on the electric charge carrying medium 3 from the direction of the photosensitive member 1.

First, the electric charge carrying medium 3 is placed face-to-face to the photosensitive member 1 with a gap of about 10 μm therebetween. The electric charge carrying medium 3 comprises an electric charge retaining layer support member 15 made of glass of 1 mm thick and with vacuum-deposited aluminum electrode of 1000 Å thick, and an electric charge retaining layer 11 of 10 μm thick is formed on this electrode.

First, as shown in FIG. 2 (a), the electric charge carrying medium 3 is set to the photosensitive member 1 with a gap of about 10 μm, and voltage is applied between the electrodes 7 and 13 from the power source 17 as shown in FIG. 2 (b). If it is in dark place, no change occurs between the electrodes because the photosensitive layer in the photosensitive member is a high-resistance material. When light enters from the direction of the photosensitive member 1, the photosensitive layer 9 where light enters are turned to electrically conductive. Discharge occurs between them and the electric charge retaining layer 11, and electric charge is accumulated in the electric charge retaining layer 11.

When the exposure is completed, voltage is turned off as shown in FIG. 2 (c). By taking out the electric charge carrying medium 3 as shown in FIG. 2 (d), the formation of electrostatic latent image is completed.

The electrostatic latent image thus formed is exposed to air environment, but information electric charge is preserved over long period without discharging whether it is dark or light if the insulating protective film is laminated on the electric charge retaining layer. The information electric charge is simply accumulated on the surface in some cases or it enters into the interior near the surface of the insulating material microscopically and electrons or holes are trapped in the material structure in some cases. Thus, it is preserved for long time.

As the methods to input the information using the photosensitive member of this invention, there is a method to use electrostatic camera, or a method to record by laser. In the electrostatic camera, the recording member comprises photosensitive member and electric charge carrying medium instead of photographic film, and voltage is applied on two electrodes. By accumulating electric charge on the electric charge retaining layer according to the quantity of incident light, electrostatic latent image is formed on the electric charge carrying medium. Mechanical shutter or electric shutter may be used.

It is also possible to separate the light information into R, G and B optical components through prism and color filter. By taking this out as parallel beams, one frame of image can be formed by 3 sets of electric charge carrying media where light is separated into R, G and B components, or R, G and B images can be aligned on a plane, and one frame of image can be formed by one set of these images. Color photographing is thus achievable.

In the method to record by laser, argon laser (514.488 nm), helium-neon laser (633 nm), or semiconductor laser (780 nm, 810 nm, etc.) can be used. By placing the photosensitive member and the electric charge carrying medium at face-to-face positions, voltage is applied. Under this condition, laser exposure corresponding to image signal, character signal, code signal or diagram signal is performed by scanning. Analog recording such as image recording is achieved by modulating light intensity of laser, and digital recording such as the recording of characters, codes, diagrams is performed by on-off control. For the image formed by dots, dot generator on-off control is performed on laser beam.

Next, description is given on the method to reproduce electrostatic information thus recorded.

Figure 3:
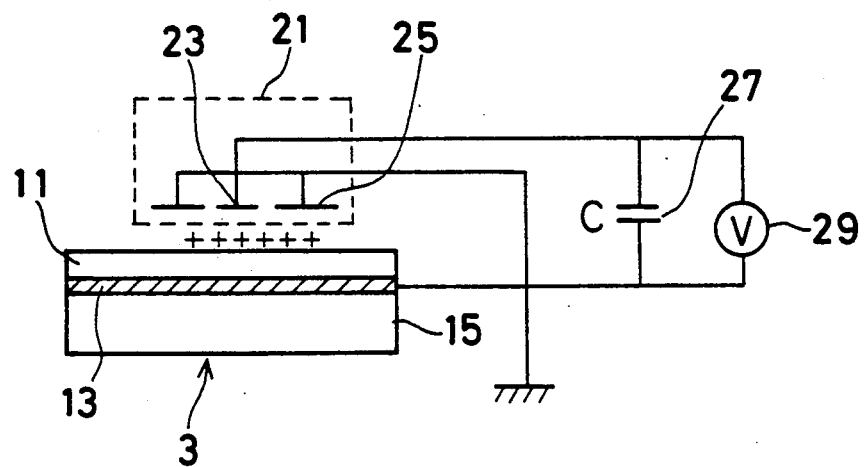
FIG. 3 is a drawing to show an example of potential reading method of DC amplification type.

FIG. 3 shows an example of potential reading method as a method to reproduce electrostatic information on the electric charge carrying medium, and the same number refers to the same component as in FIG. 1. In the figure, 21 represents a potential reading unit, 23 a detection electrode, 25 a guard electrode, 27 a capacitor, and 29 a voltmeter.

When the potential reading unit 21 is placed face-to-face to the electric charge accumulated surface of the electric charge carrying medium 3 from above the protective film, the electric field is generated by the electric charge accumulated on the electric charge retaining layer 11 of the electric charge carrying medium 3, and the induction electric charge equivalent to the electric charge on the electric charge carrying medium is generated on the detection electrode. Because the capacitor 27 is charged with the electric charge having opposite polarity but equivalent to the induction electric charge, potential difference corresponding to the induction electric charge is generated between the electrodes of capacitor. By reading this value on a voltmeter 29, the potential of the electric charge carrying medium can be obtained. By scanning the surface of the electric charge carrying medium with the potential reading unit 21, the electrostatic latent image can be outputted as electric signal. When the detection electrode 23 is used alone, resolution is lowered because of the presence of electric field (line of electric force) due to the electric charge in wider range than the portion corresponding to the detection electrode of the electric charge carrying medium. Thus, a grounded guard electrode 25 around the detection electrode may be provided. In so doing, the line of electric force is directed toward the direction perpendicular to the plane, and only the line of electric force on the portion facing to the detection electrode 23 exerts action, and the potential of the portion approximately equal to the area of the detection electrode can be read. Because accuracy and resolution of potential reading greatly differ according to the shape and size of detection electrode and guard electrode as well as the gap from the electric charge carrying medium, it is necessary to design by obtaining optimal condition according to the desired performance.

Or, the image electric charge on the electric charge carrying medium can be reproduced as information through electro-optical crystal by irradiating laser beam from the direction of the electric charge carrying medium electrode provided with reflection preventive film. In this case, the material of the electric charge carrying medium must be made of transparent material. It is preferable to place the electro-optical crystal in the optical path. As such electro-optical crystal, barium titanate, lithium tantalate ($LiTaO_3$), etc. giving electro-optical effect may be used.

Figure 4:
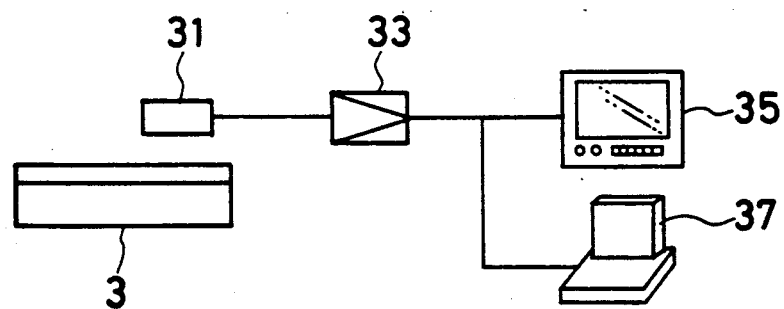
FIG. 4 schematically shows the reproduction of electrostatic information.

FIG. 4 shows the arrangement of electrostatic information reproducing method, where 31 represents a potential reading unit, 33 an amplifier, 35 a CRT, and 37 a printer.

In this figure, electric charge potential is detected by the potential reading unit 31. The detected output is amplified by the amplifier 33, is displayed on CRT 35, and printed out by the printer 37. In this case, the portion to be read can be arbitrarily selected and outputted at any desired time, and reproduction can be repeatedly performed. Because electrostatic latent image is obtained as electric signal, it is possible to use it for the recording on the other recording medium when necessary.

In the following, the features of the invention will be described by examples.

EXAMPLE 1

On a glass substrate (Corning; 7059 glass; 45×50 mm, 1.1 mm thick), indium tin-oxide transparent electrode (100 Ω/sq.) was formed by electronic gun vacuum deposition. $SiO_2$ film (0.1 μm) was formed on this electrode as electric charge injection preventive layer by sputtering method, and this was used as photosensitive member substrate.

On the electric charge injection preventive layer of this photosensitive member substrate, a-selenium-tellurium mixed vacuum deposition layer (tellurium concentration: 42 wt %) was formed in thickness of 0.1 μm. Vapor deposition condition was as follows:

Vacuum evaporation unit (JEE-4B; JEOL, Ltd.) was used, and the attainable vacuum degree was set to $2.0 \times 10^{-5}$ Torr. As evaporation materials, granular selenium (purity 99.999%; Mitsubishi Metal Corp.), and granular tellurium (99.99%; High Purity Chemical Lab. Co., Ltd.) were used. Granular selenium was evaporated in an alumina crucible (Nilaco Corp.), and granular tellurium was evaporated by sublimation metal boat (Nilaco Corp.). To prevent crystallization of selenium and dispersion of tellurium, substrate holder was cooled with water to maintain the substrate at room temperature. By independently measuring the deposition rate of the evaporation sources of selenium and tellurium by crystal oscillator thickness monitor (CRTM-7000; Japan Vacuum Technology Co., Ltd.), vacuum evaporation was performed through feedback of evaporation power source so that a constant deposition rate ratio is reached. The calibration curve to the composition was prepared in advance, and the deposition rate ratio was determined to obtain the composition as desired. In case tellurium concentration is 42 wt %, the deposition rate ratio of selenium and tellurium was set to 20:10.

Next, only selenium was vacuum-deposited (thickness: 30 μm) to form electric charge transport layer, and the photosensitive member of this invention was prepared.

EXAMPLE 2

Se-5N shot (Mitsubishi Metal Corp.) and Te-6N powder (Furuuchi Chemical Co., Ltd.) were placed in alumina crucible and tungsten boat respectively, and these were put in a vacuum evaporation unit (JEOL, Ltd.). On this unit, Corning 7059 glass (45×50×1.1 t; optically polished) was mounted, on which ITO electrode layer and $SiO_2$ film were formed in thickness of 0.1 μm as electric charge injection preventive layer.

Under the condition that the attainable vacuum degree of the vacuum system is $2.0 \times 10^{-5}$ Torr and substrate temperature is at room temperature (water-cooled), the correlation between the deposition rate of selenium and tellurium and the compositions of a-selenium and tellurium on the deposited film had been obtained in advance. Then, only selenium (tellurium concentration; 0 wt %) was vacuum-deposited in thickness of 500 Å on the surface of the electric charge injection preventive layer on the substrate.

Then, tellurium concentration on the vacuum-deposited film was gradually increased, and vacuum evaporation was performed in such manner that tellurium concentration reaches 50 wt % when the film is formed in thickness of 2000 Å.

Next, vacuum evaporation was performed in thickness of 1000 Å with tellurium concentration of 50 wt and the quantity of tellurium evaporation was decreased so that tellurium concentration reaches 0 wt % when the film of 1000 Å is formed.

After the vacuum evaporation of a-selenium-tellurium layer, only a-selenium was vacuum-deposited in thickness of 20 μm to form an electric charge transport layer. Thus, the photosensitive member of this invention was prepared.

EXAMPLE 3

(Preparation of electric charge carrying medium)

On a glass substrate of 1 mm thick, aluminum electrode was laminated in thickness of 1000 Å by vacuum evaporation method ($10^{-5}$ Torr). The fluorine-containing resin CYTOP (tradename; Asahi Glass Co., Ltd.; water absorption 0.01%; specific resistance $1 \times 10^{18}$ Ω.cm) was dissolved in fluorine type solvent and 5% solution was coated on the above aluminum electrode by blade coater. After drying, film of about 3 μm was laminated, and the electric charge carrying medium was prepared.

Next, this electric charge carrying medium and the photosensitive member prepared in the above Example 1 were placed face-to-face as shown in FIG. 2 with polyester film of 12 μm thick as a spacer. DC voltage of +800 V was applied between two electrodes with the photosensitive member as positive and the electric charge retaining layer as negative.

Under voltage application, exposure was performed for one second by red light having wavelength of 650 nm from the direction of photosensitive member,. and electrostatic latent image was formed on the electric charge retaining layer 11. Then, the electric charge carrying medium 3 was taken out.

When the surface potential on this electric charge carrying medium was measured by the surface electrometer of FIG. 3, surface potential having dark potential of 150 V and light potential of 300 V was measured.

Figure 5:
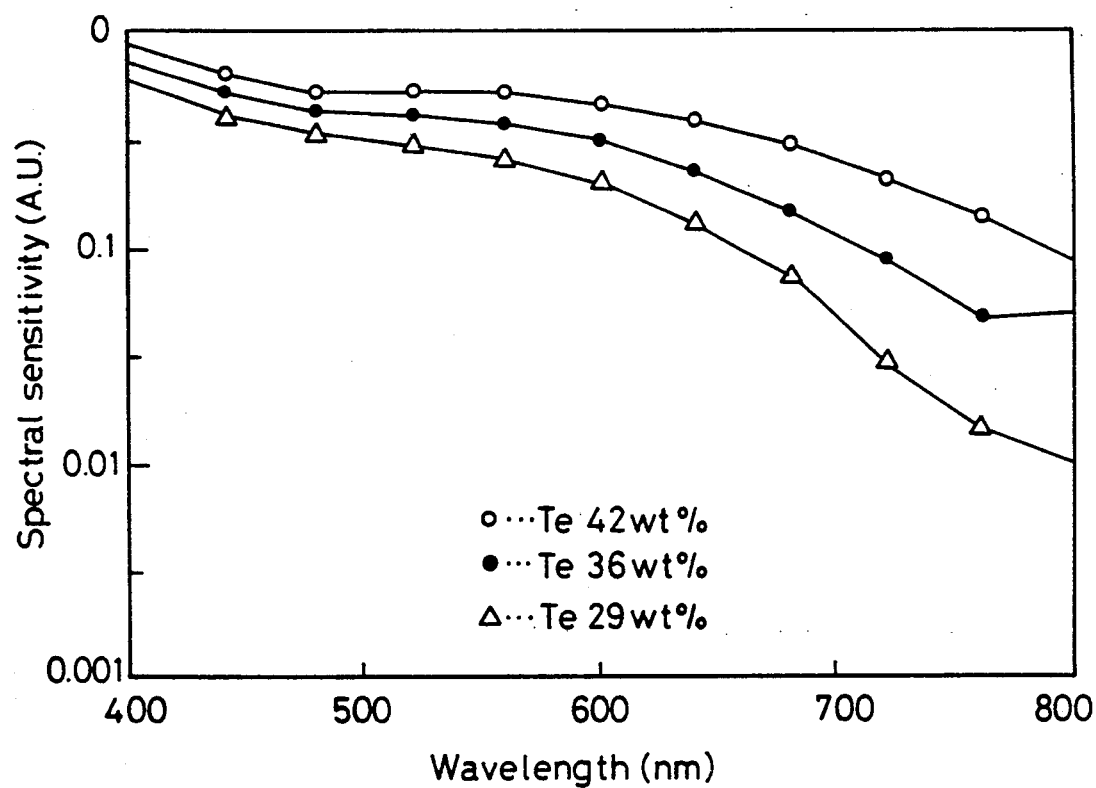
FIG. 5 is a drawing to explain tellurium concentration dependency of spectral sensitivity in the photosensitive member of this invention.

In the photosensitive member prepared in the Example 1, tellurium concentration of the a-selenium-tellurium mixed layer was changed to 36 wt % and 29 wt %, and the photosensitive member was prepared by the same procedure. Then, the dependency of spectral sensitivity on tellurium concentration in the photosensitive member was measured. The results are given in FIG. 5.

It is evident from this figure that, when tellurium concentration on a-selenium-tellurium layer is decreased, the sensitivity in the long wavelength region is lowered.

In the photosensitive member prepared in the Example 1, tellurium concentration in a-selenium-tellurium layer was changed to 65 wt %, and the photosensitive member was prepared. When electrostatic information was recorded on the electric charge carrying medium by the same procedure in the above example, surface potential having dark potential of 290 V and light potential of 300 V was measured. Dark potential has increased, and it was not possible to have adequate contrast.

EXAMPLE 4

Using the photosensitive member prepared in the above Example 2 and the electric charge carrying medium prepared in the Example 3, electrostatic information recording was performed by the same procedure as in the Example 3.

When the surface potential on the electric charge carrying medium was measured by the surface electrometer of FIG. 3, the surface potential having dark potential of 250 V and light potential of 350 V was measured.

COMPARATIVE EXAMPLE 1

In the preparation of the photosensitive member of the above example 1, a-selenium-tellurium layer (thickness 1 μm) containing tellurium by 50 wt % was vacuum-deposited on the photosensitive member substrate and a-selenium layer of 20 μm thick was deposited. Thus, the photosensitive member was obtained.

Using this photosensitive member, electrostatic information was recorded on the electric charge carrying medium by the same procedure as the above example, and the surface potential was measured by the same procedure. Both dark potential and light potential were 350 V, and it was not possible to have adequate contrast.

COMPARATIVE EXAMPLE 2

In the preparation of the photosensitive member in the above Example 1, a-selenium layer of 30 μm thick was deposited on the photosensitive member substrate to prepare the photosensitive member, and the spectral sensitivity was measured.

Figure 6:
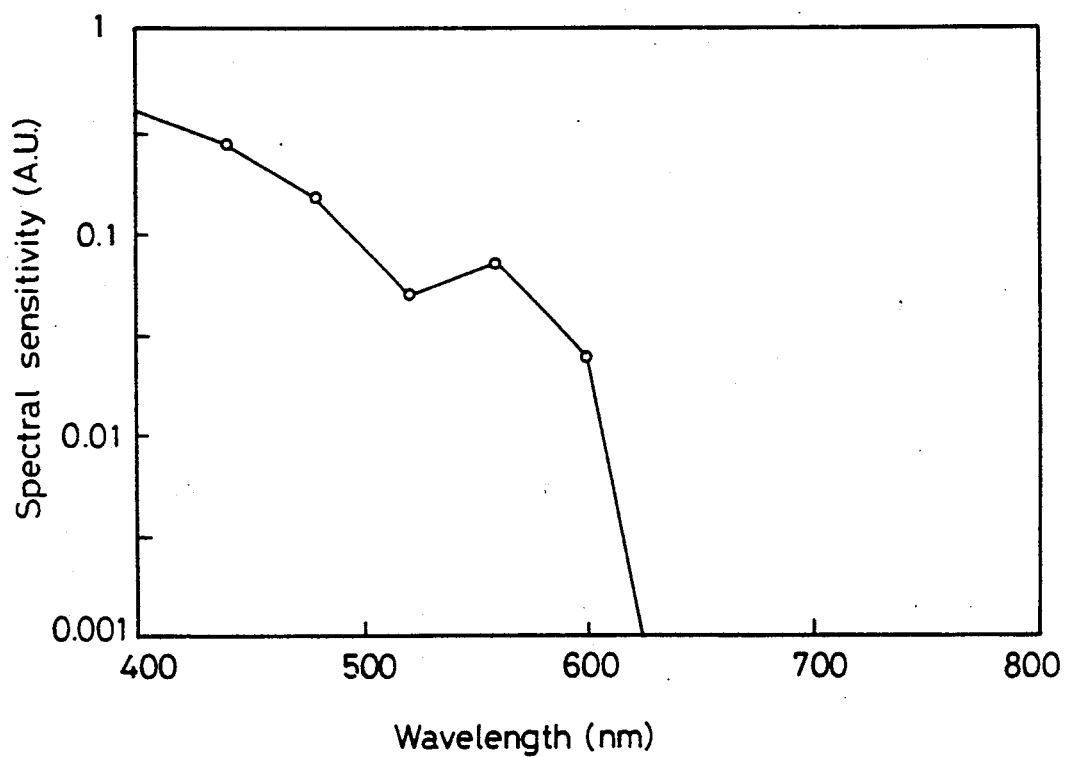
FIG. 6 is a drawing to explain tellurium concentration dependency of spectral sensitivity of a comparative photosensitive member.

The results are given in FIG. 6. It is evident from the figure that there is no sensitivity in long wavelength region on a photosensitive member having a-selenium layer only.

What we claim is:

1. An electrostatic information recording method, characterized in that a photosensitive member comprises an electric charge injection preventive layer, an a-selenium-tellurium mixed vacuum evaporation layer having tellurium concentration within the range of 20–50 wt % with uniform concentration on the vacuum-deposited surface and having thickness of 0.03–0.2 μm, and an electric charge transport layer of 30 μm thick sequentially laminated on a transparent electrode layer, that said photosensitive member is placed face-to-face to an electric charge carrying medium comprising an electrode layer and an electric charge retaining layer on optical axis, and that electrostatic latent image corresponding to the incident light image is formed on the electric charge carrying medium by performing exposure under voltage application between two electrodes or by applying voltage under exposure.

2. An electrostatic information recording method according to claim 1, wherein a-selenium-tellurium mixed vacuum deposition layer of said photosensitive member is provided on the electric charge injection preventive layer through an a-selenium layer of 50–1000 Å thick substantially not containing tellurium component.

3. An electrostatic information recording method according to claim 1, wherein a-selenium-tellurium mixed vacuum evaporation layer in said photosensitive member is formed in such manner that tellurium component is contained with concentration gradient in lateral direction of the layer.

4. An electrostatic information recording method according to claim 2, wherein a-selenium-tellurium mixed vacuum evaporation layer in said photosensitive member is formed in such manner that tellurium component is contained with concentration gradient in lateral direction of the layer.

* * * * *